United States Patent [19]

Matsumi

[11] Patent Number: 5,106,769
[45] Date of Patent: Apr. 21, 1992

[54] PROCESS FOR MANUFACTURING BI-CMOS TYPE SEMICONDUCTOR INTEGRATED CIRCUIT

[75] Inventor: Koji Matsumi, Tokyo, Japan

[73] Assignee: Oki Electric Industry Co., Ltd., Tokyo, Japan

[21] Appl. No.: 665,222

[22] Filed: Mar. 6, 1991

[30] Foreign Application Priority Data

Mar. 13, 1990 [JP] Japan .................. 2-59932

[51] Int. Cl.⁵ .......................... H01L 21/265
[52] U.S. Cl. .......................... 437/34; 437/56; 437/33; 437/69; 148/DIG. 9
[58] Field of Search .......... 437/34, 56, 33, 31, 437/69, 62, 63, 72; 148/DIG. 9; 357/43

[56] References Cited

U.S. PATENT DOCUMENTS

| | | | |
|---|---|---|---|
| 4,406,049 | 9/1983 | Tam et al. | 437/69 |
| 4,777,147 | 10/1988 | Scott et al. | 437/57 |
| 4,879,255 | 11/1989 | Deguchi et al. | 437/34 |
| 4,889,829 | 12/1989 | Kawai | 437/69 |
| 4,946,798 | 8/1990 | Kawakatsu | 437/31 |
| 4,957,874 | 9/1990 | Soejima | 437/34 |

FOREIGN PATENT DOCUMENTS

0140656 6/1989 Japan .................. 437/34

Primary Examiner—Brian E. Hearn
Assistant Examiner—Michael Trinh
Attorney, Agent, or Firm—Wenderoth, Lind & Ponack

[57] ABSTRACT

A process of manufacturing a Bi-CMOS type semiconductor integrated circuit according to the present invention by to providing an isolation procedure wherein PMOS and NMOS transistor isolation areas are selectively oxidixed so as to form a second isolation oxide film, simultaneous with the selective oxidation of the polysilicon layer deposited on the bipolar transistor area after the semiconductor substrate in the bipolar transistor isolation area, which has been removed to a required thickness and selectively oxidized so as to form a thick first isolation oxide film for the bipolar transistor.

11 Claims,.12 Drawing Sheets

PROCESS FOR MANUFACTURING BI-CMOS TYPE SEMICONDUCTOR INTEGRATED CIRCUIT

BACKGROUND OF THE INVENTION

1. Field of the Invention

The present invention relates to a process of manufacturing a Bi-CMOS type semiconductor integrated circuit in which a bipolar transistor and a CMOS transistor are formed on the same semiconductor substrate.

2. Prior Art

Conventionally, in a Bi-CMOS type integrated circuit, bipolar devices and CMOS devices have been formed on the same chip so that the driving capability of the CMOS devices are enhanced by the bipolar devices in order to obtain high responsive CMOS. Accordingly, although the Bi-CMOS type integrated circuits have exhibited both bipolar and CMOS characteristics, they have been able to exhibit excellent functions such as high speed operation, high density, high resistant-voltage, high driving capability, low power consumption and the like.

The high speed bipolar integrated circuit has a thick oxide film which is formed by a deep selective oxidation process (which will be denoted hereinbelow as "LOCOS-1"), corresponding to the thickness of epitaxial growth, in order to obtain an isolation.

Figure 1A:
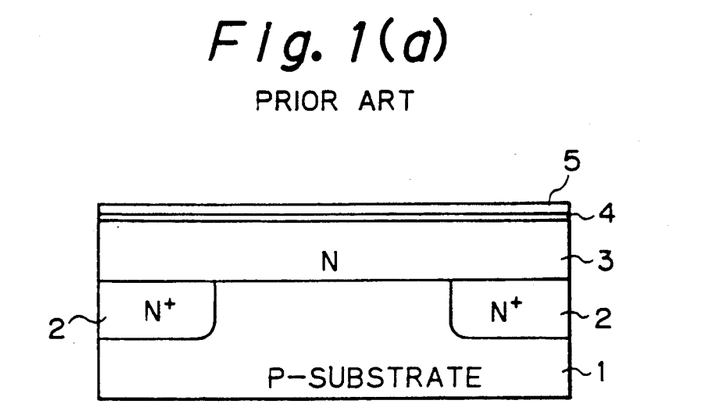
FIG. 1(a) to 1(c) are views illustrating a conventional first isolation process.
Figure 1B:
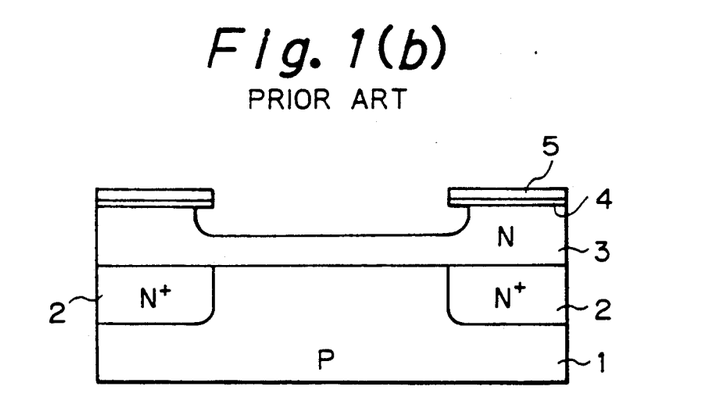
Figure 1C:
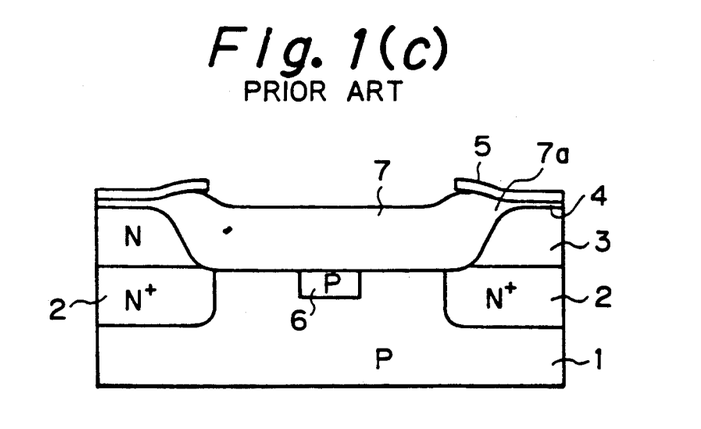

FIGS. 1(a) to 1(c) show the process steps of the above-mentioned LOCOS-1.

As shown in FIG. 1(a), after an N+ buried diffusion layer 2 being formed on a P type Si substrate, an N type epitaxial layer 3, a thin oxide film 4 and an Si$_3$N$_4$ film 5 are formed thereover successively in that order.

Then, as shown in FIG. 1(b), the Si$_3$N$_4$ film 5 and the thin oxide film 4 are selectively removed by a well-known photoetching technic, and thereafter, using the Si$_3$N$_4$ film 5 as a mask, the epitaxial layer 3 is etched down to a thickness which is about one-half of the original thickness thereof.

Next, as shown in FIG. 1(c), a heavy doped layer 6 preventing a channel is formed on the part of the epitaxial layer 3 which has been etched, by implanting B+ ions into that part.

Then, using the Si$_3$N$_4$ film 5 as a mask, a selective oxidation process is carried out to form an isolation oxide film 7 which reaches the N+ buried diffusion layer 2, as shown in FIG. 1(c). Thereafter, the Si$_3$N$_4$ film 5 and a thin oxide film 4 are removed so as to complete the isolation.

As mentioned above, in a high speed bipolar device, a thick oxide film should be formed for isolation after silicon is etched, in order to reduce the isolation capacity and substrate capacity so as to obtain a high speed performance and in order to completely isolate devices from each other.

Meanwhile, in a CMOS device, the thickness of an oxide film for isolation has not to be as thick as that of the bipolar device since the device operation is controlled by a surface channel, and accordingly, a selective oxidation process in which etching of silicon is not required (which will be denoted hereinbelow as "LOCOS-2") is used. The process steps of this LOCOS-2 will be simply explained with reference to FIGS. 2(a) to 2(b).

Figure 2A:
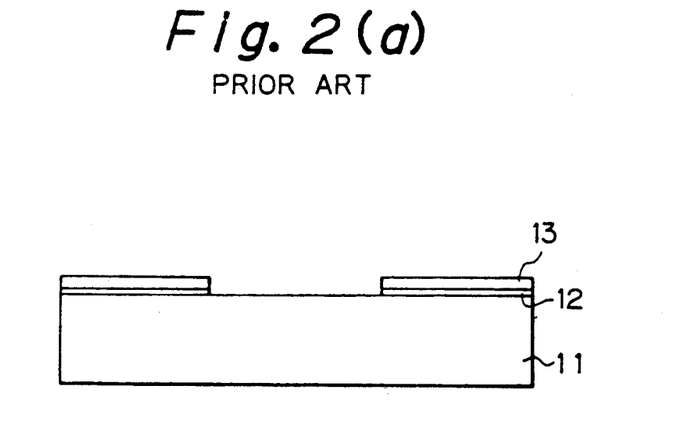
FIG. 2(a) and 2(b) are views illustrating a conventional second isolation process.

As shown in FIG. 2, a thin oxide film 12 and a Si$_3$N$_4$ film 13 are at first laminated and selectively formed on a P type Si substrate 11.

Figure 2B:
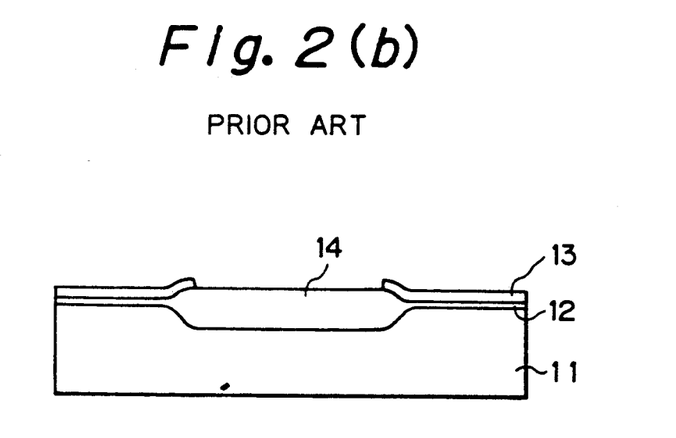

Then, using this Si$_3$N$_4$ film 13 as a mask, a selective oxidation process is carried out to form an isolation oxide film 14 as shown in FIG. 2(b) so as to complete the isolation.

Thus, in the CMOS device, the isolation can be attained by the isolation oxide film which is thinner than that of the bipolar device, and accordingly, the step of etching silicon is unnecessary.

As mentioned above, although both LOCOS-1 and LOCOS-2 are not different from each other in view of the use of a thick oxide film for isolation, which is formed by selective oxidation and which will be hereinbelow denoted as "field oxide film", the former is distinguished from the latter because etching of an epitaxial layer is necessary in order to prevent formation of a large surface step due to cubic expansion caused by a thick oxide film formed by selective oxidation. These field oxide films are used in the subsequent steps of self-aligningly forming several diffusion layers such as a base, an emitter, a source, a drain and the like, and contacts, that is, they are very effective since the process steps can be simplified and the area of the devices can be reduced. In the case of the bipolar, the thickness of the oxide film is in the range of 1 to 2 μm, and in the case of the CMOS, it is in a range of 0.5 to 1 μm.

With a conventional high speed Bi-CMOS, the isolation by the LOCOS-2 which is mainly taken into consideration for the function of the CMOS has been used in general since it has simple isolation steps.

However, with such a high Bi-CMOS, a part of the characteristic of a high-speed bipolar has been sacrificed if the LOCOS-2 is used for the isolation. In particular, there has been raised such a problem that the substrate capacity and an isolation capacity are increased.

Meanwhile, if the LOCOS-1 isolation process is applied for a Bi-CMOS structure, the so-called bird's beak 7a as shown in FIG. 1(c) becomes large, which is caused by a lateral growth of an oxide film when the isolation oxide film 7 is formed. That is, there has been raised the defect of incurring an increase in the area of isolation. This causes a fatal disadvantage such that the packing density for the CMOS section is lowered, and further, conventional CMOS design rules which are designed with the LOCOS-2 cannot be used directly although the characteristic of the bipolar device can be ensured. In the Bi-CMOS technology, the design rules which are compatible with those of the CMOS is in general strongly required in order to effectively use abundant CMOS circuit libraries. As a result, the above-mentioned LOCOS-2 has been mainly used for isolation.

Further, although it may be considered easily that the process of the LOCOS-1 and the process of the LOCOS-2 are merely used successively, not only the processes become long and complicated, that is, particularly in the case of self-aligningly producing a high-speed bipolar by selectively oxidizing polysilicon, the selective oxidation should be repeated three times, but also the number of heat treatments are increased so that the control of the diffusion layer is difficult. Accordingly, it has been not useful.

As mentioned above, even though either processes is used for the Bi-CMOS, there has been raised problems such that the packing density for a CMOS transistor is lowered, and conventional CMOS design rules cannot be used. Further the process becomes lengthy thus, accordingly, is not useful, and such processes are technically unsatisfactory.

SUMMARY OF THE INVENTION

According to the present invention, conventional CMOS design rules can be applied to Bi-CMOS type integrated circuits.

Further, according to the present invention, a process of manufacturing Bi-CMOS type integrated circuits can be simplified.

Further, according to the present invention, the base series resistance can be decreased, and accordingly, bipolar transistors having excellent high frequency characteristics ca be fabricated.

Further, according to the present invention, the packing density for bipolar transistors can be increased.

BRIEF DESCRIPTION OF THE ACCOMPANYING DRAWINGS

FIG. 3(a) to 3(m) are views illustrating a first embodiment of the process of manufacturing a Bi-CMOS type semiconductor integrated circuit, according to the present invention; and FIG. 4(a) to 4(m) are views illustrating a second embodiment of the process of manufacturing a Bi-CMOS type semiconductor integrated circuit, according to the present invention.

DETAILED DESCRIPTION OF THE PREFERRED EMBODIMENTS

Explanation will be made of a process of manufacturing a Bi-CMOS type semiconductor integrated circuit according to the present invention with reference to the drawings in which like reference characters are used to designate like or corresponding parts throughout the drawings which schematically illustrates these parts for the sake of understanding.

Accordingly, dimensions, shapes and arrangements which will be explained in the following preferred embodiments are only for illustrative purposes and are not for restrictive purposes, and therefore, the conception or technical scope of the present invention should not be limited to these preferred embodiment.

FIRST EMBODIMENT

Referring to FIGS. 3(a) to 3(m), the first embodiment will be detailed.

Figure 3A:
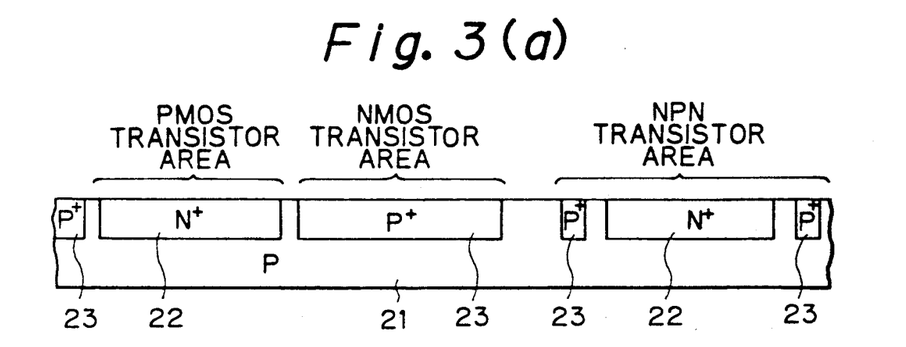

First, as shown in FIG. 3(a), N+ and P+ buried diffusion layers 22, 23 are formed on the surface of a P type semiconductor substrate 21. The N+ buried diffusion layer 22 is formed by diffusion in respective forming areas with the use of As, Sb so as to have 20 to 100 $\Omega/\square$ in order to decrease the collector series resistance of an NPN transistor and in order to prevent a PMOS transistor from causing parasitic bipolar action. The P+ buried diffusion layer 23 is formed previously in the isolation areas of the NPN transistors by an ion implantation process, that is, it is formed by diffusion so as to have 50 to 300 $\Omega/\square$, usually with the use of B (boron) in order to ensure the fabrication of isolation areas by oxide film formed in later steps. Further, the P+ buried diffusion layer 23 is simultaneously formed in an NMOS transistor forming area in order to prevent an NMOS transistor from causing parasitic bipolar action.

Figure 3B:
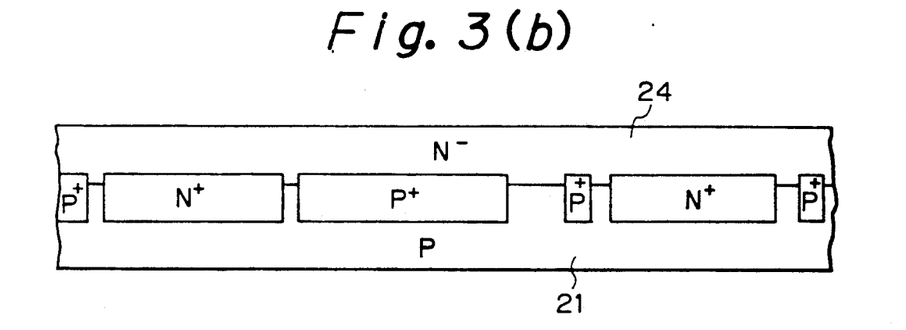

Then, as shown in FIG. 3(b), an N− epitaxial layer 24 having about 2 $\mu$m is grown on the semiconductor substrate 21. In this case, the epitaxial layer 24 should be formed so as to have a resistivity and a thickness by which the device characteristic of the NPN transistor and the gate threshold voltage of the NMOS transistor can be controlled.

Figure 3C:
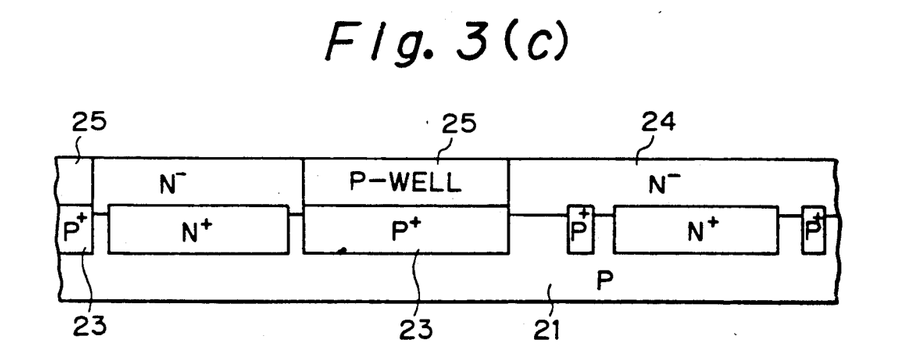

Then, as shown in FIG. 3(c), B (boron) which is a P type dopant is selectively ion-implanted into the epitaxial layer 24, and then the dopant is diffused by heat-treatment at 1,100 deg. C. Thereby, a P well layer 25 which determines the threshold voltage of the NMOS transistor is formed in the epitaxial layer 24. At this time and at the time of forming the above-mentioned epitaxial layer, the P+ buried diffusion layer 25 is diffused upward from the semiconductor substrate 21 due to the heat treatment so as to approach the P well layer 25 which is formed by diffusion from the surface of the epitaxial layer 24. Since the P+ buried diffusion layer 23 and the P well layer 25 are surely connected together by subsequent heat treatment, the figures show that these layers 23, 25 are already connected together.

Figure 3D:
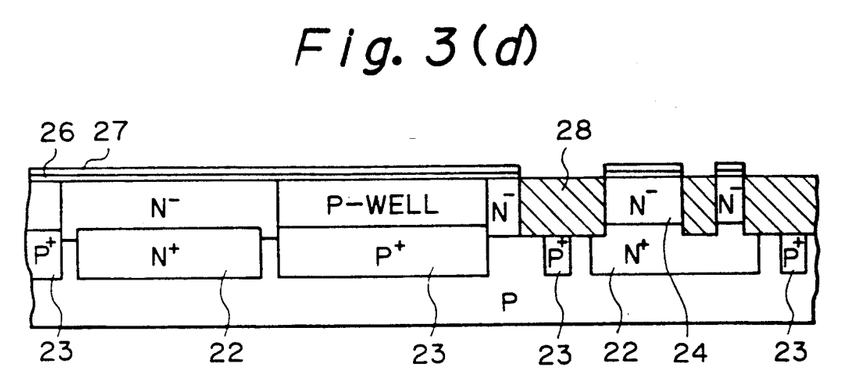

Next, as shown in FIG. 3(d), after a thin oxide film 26 having at thickness of about 500 Å and a nitride film having at thickness of about 2,000 Å is grown on the surface of the semiconductor substrate, the nitride film 27 and the thin oxide film 26 are selectively removed in the isolation area of the NPN transistor as shown in the same figure, and using the nitride film 27 as a mask, the epitaxial layer 24 in that area is etched down to a thickness which is about one-half of the film thickness thereof. Thereafter, using the nitride film 27 as a mask, the epitaxial layer 24 in that part is selectively oxidized so that a first isolation oxide film 28 for the isolation of the NPN transistor is completed by a thickness with which it reaches the N+buried diffusion layer 22. At this time, the first isolation oxide film should be formed at a relative low temperature by a high pressure oxidation process in order to avoid changing the concentration profiles of the buried diffusion layer 22, 23 and the P well layer. For example, if the pressure is 7 atm and the temperature is 1,000 deg. C, the oxidation is formed for 120 minutes so as to form 2 $\mu$m thickness of the oxide film.

Figure 3E:
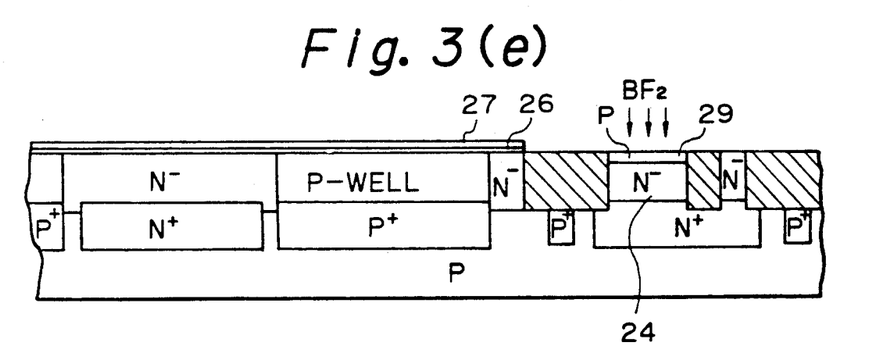

Next, as shown in FIG. 3(e), after the remaining oxide film 26 and the remaining nitride film 27 in the NPN transistor area is selectively a P type dopant such as BF$_2$ is selectively ion-implanted with the use of a resist pattern which is not shown, so as to form an extremely thin main base layer 29 of the NPN transistor on the epitaxial layer 24. It is noted that BF$_2$ is a heavy dopant containing boron, and accordingly, it is implanted by about $5 \times 10^{13}$ cm$^{-1}$ with an accelerating voltage of 40 KeV, and then is annealed at a temperature of 900 deg. C. so as to obtain a diffusion depth of 0.2 $\mu$m.

Figure 3F:
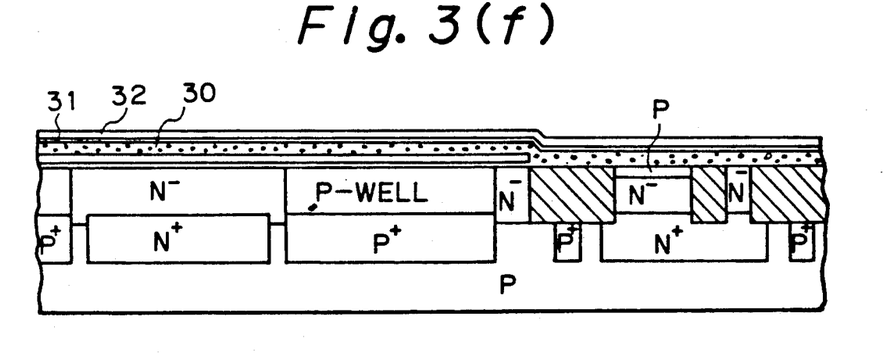

Then, as shown in FIG. 3(f), a polysilicon layer 30 is grown over the whole surface of the semiconductor substrate up to a thickness of 2,000 to 5,000 Å, and further, a thin oxide film 31 of about 500 Å and a nitride film 32 of about 1,500 Å are laminated thereover.

Figure 3G:
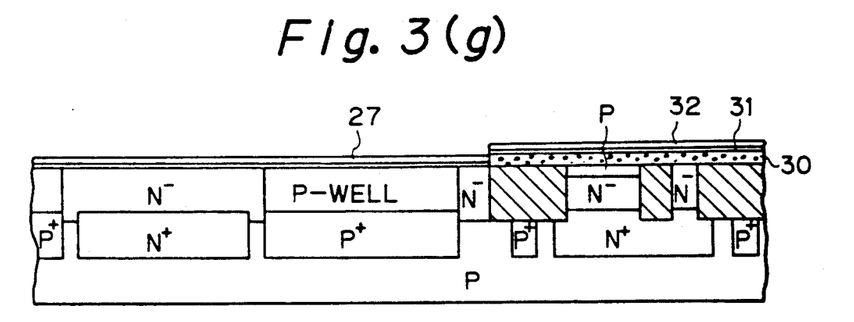

Next, as shown in FIG. 3(g), the nitride film 32, the thin oxide film 31 and the polysilicon layer 30 on the PMOS and NMOS transistor forming areas are selectively removed by a well-known technique.

Figure 3H:
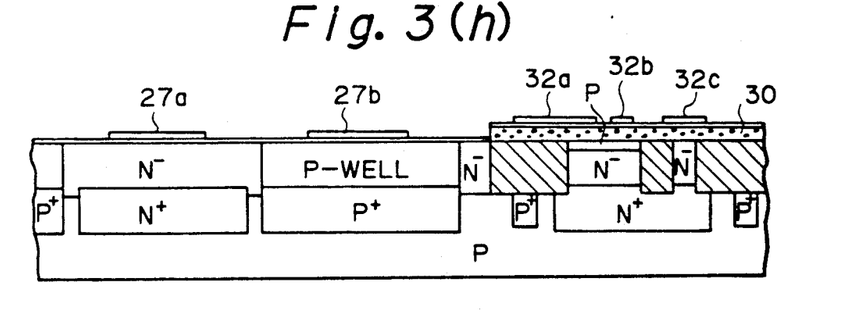

Then, as shown in FIG. 3(h), the nitride film 27 is selectively removed while it being allowed to remain on the active areas of the PMOS and NMOS transistors. Simultaneously, the nitride film 32 is selectively removed, excepting the parts on the polysilicon layer 30 where lead-out electrodes for the side base, emitter and collector of the NPN transistor are formed. Thereby, the nitride films 27, 32 are turned into nitride film patterns 27a, 27b, 32a, 32b, 32c.

Figure 3I:
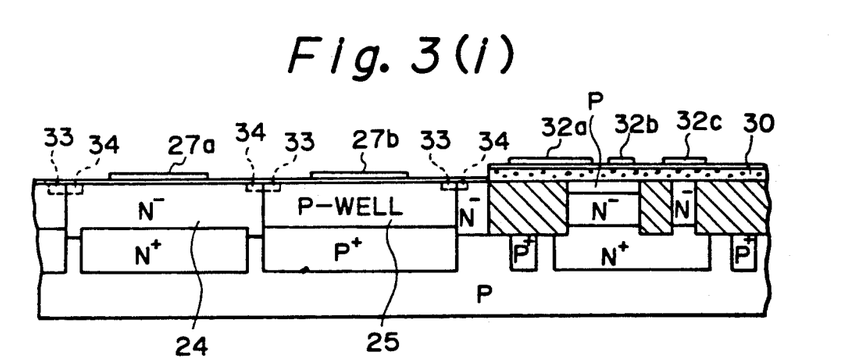

Next, as shown in FIG. 3(i), using a resist as a mask which is not shown, a channel stopper layer 33 for the NMOS transistor and a channel stopper layer 34 for the PMOS transistor are formed by ion-implantation, respectively on the P well layer 25 and on the epitaxial layer 24 in the PMOS transistor forming area.

Figure 3J:
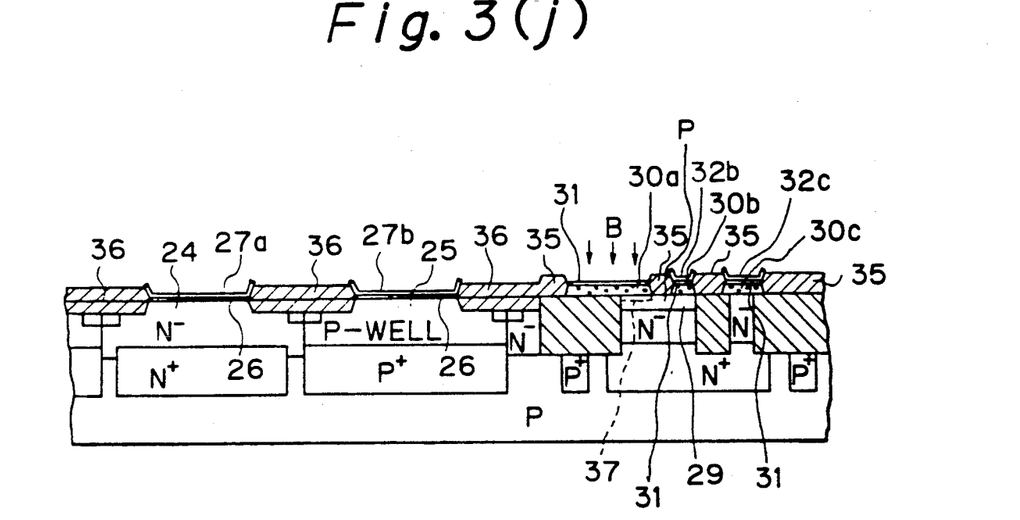

Thereafter, using the remaining nitride patterns 27a, 27b, 27c, 32a, 32b, 32c as masks, a second selective oxidation process is carried out. By this second selective oxidation process, as shown in FIG. 3(j), the polysilicon layer 30 is separated into a polysilicon layer 30a as a lead-out electrode for the side base of the NPN transistor, a polysilicon layer 30b as a lead-out electrode for the emitter of the same transistor and a polysilicon layer 30c as a lead-out out electrode for the collector of the same transistor. Reference numeral 35 denotes an oxide film into which the polysilicon layer 30 is turned. Simultaneously, a second isolation oxide film 36 for isolation between the PMOS and NMOS transistors is formed on the P well layer and on the epitaxial layer 24 in the PMOS transistor forming area. At this time, the second selective oxidation process is performed desirably at a relatively low temperature with the use of a high pressure oxidation process. For example, oxidation under a pressure of 7 atm at a temperature of 1,000 deg. C. is made for about 20 minutes so as to obtain an oxide film having a thickness of 4,000 to 6,000 Å which is optimum for isolation of the MOS transistor.

Next, as shown in FIG. 3(j), after the nitride film pattern 32a being removed, a high dose of P type dopant such as, boron or the like is introduced up to about $10^{14}$ to $10^{16}$ cm$^{-2}$ by ion-implantation into the polysilicon layer 30a positioned below the nitride pattern 32a serving as the side base lead-out electrode. Thereafter, it is treated to thermal oxidation by which the P type dopant is diffused into the main base layer 29 from the polysilicon layer 30a so as to form a side base layer 37 for the NPN transistor.

Figure 3K:
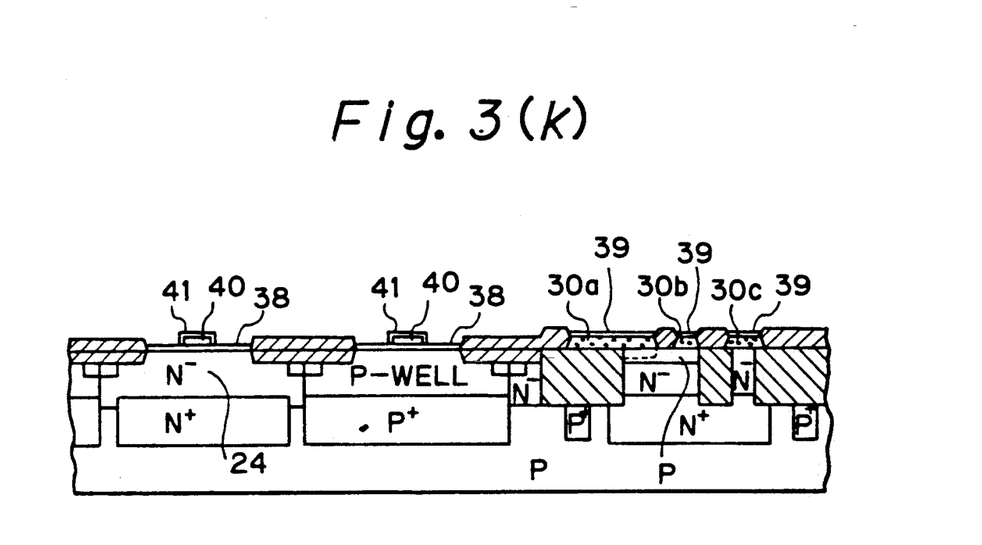

Next, as shown in FIG. 3(k), the nitride film patterns 27a, 27b, 32b, 32c and the thin oxide films 26, 31 which still remain, are all removed, and after the surface concentration of the $N^{31}$ epitaxial layer 24 being adjusted by ion-implantation in the PMOS transistor forming area in order to control the threshold voltage $V_T$ in that area as necessary, a gate oxide film 38 for the NMOS and PMOS transistors are formed (simultaneously, an oxide film 39 is formed on the polysilicon layers 30a, 30b, 30c), and a polysilicon gate electrode 40 is formed. Further, a thin mask oxide film 41 is formed around the polysilicon gate electrode 40.

Figure 3L:
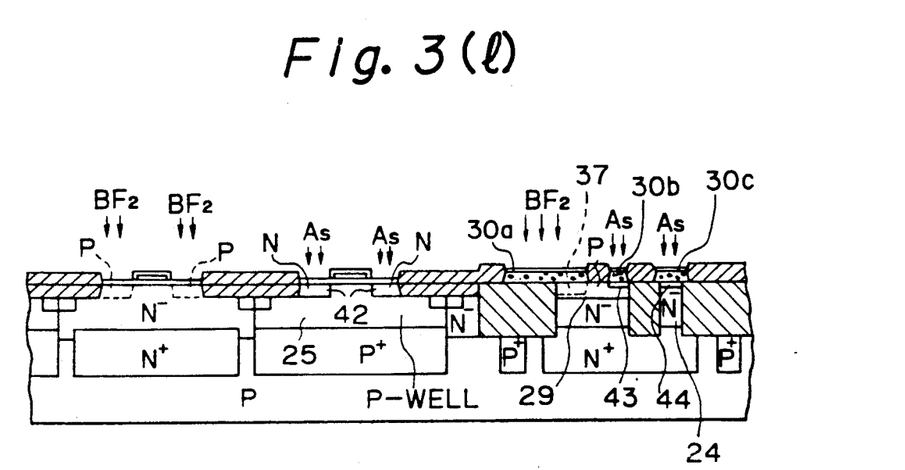

Then, as shown in FIG. 3(l), using a resist as a mask which is not shown, As which is N type dopant is ion-implanted with a high dose of about $10^{16}$ cm$^{-2}$ into the source drain area of the NMOS transistor, and into the polysilicon layers 30a, 30c serving as the lead-out electrodes for the emitter and collector of the NPN transistor. Then, after the resist being removed, it is annealed at 950 deg. C. so as to from a source drain layer 42 for the NMOS transistor within the P well layer 25. At this time, the N type dopant is simultaneously diffused into the main base layer 29 and the epitaxial layer 24 from the polysilicon layers 30b, 30c, and accordingly an emitter layer 43 and a high doped collector layer 44 for the NPN transistor are formed on the main base layer 29 and the epitaxial layer 24, respectively. At this time, the side base layer 37 is further deeply diffused simultaneously.

Figure 3M:
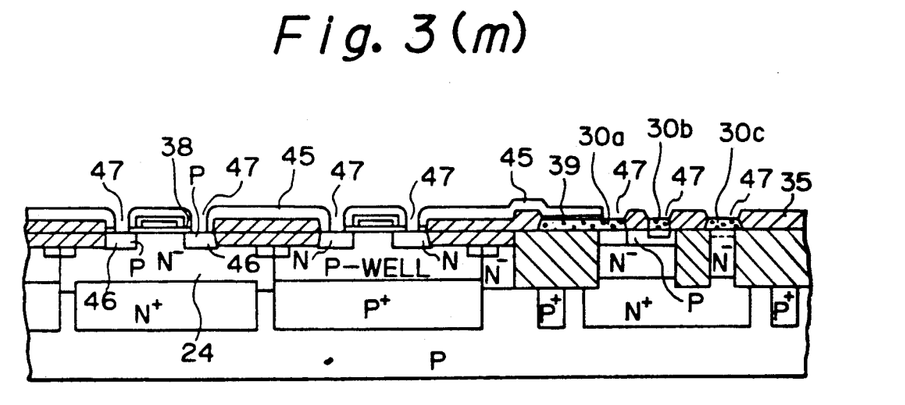

Then, again using a resist as a mask which is not shown, as shown in FIG. 3(l), a P type dopant such as BF$_2$ is ion-implanted with a dose of about $10^{15}$ cm$^2$ into an area where the source drain of the PMOS transistor is formed and into the polysilicon layer 30a serving as the side base lead-out electrode. Thereafter, as shown in FIG. 3(m), a BPSG layer 45 serving as an intermediate insulation film is formed over the whole surface of the semiconductor substrate, and is then smoothed by annealing. This annealing activates the above-mentioned dopant so as to form a source drain layer 46 for the PMOS transistor in the epitaxial layer. Further, the dopant in the polysilicon layer 30a has a role of lowering the resistance of the polysilicon layer 30a.

Thereafter, as shown in FIG. 3(m), contact holes 47 are formed in the BPSG layer 45 and the oxide films 38, 39. Contact holes 47 above the NPN transistor are formed self-aligningly by removing the BPSG layer 47 and the oxide film 39 in batch, since the polysilicon layers 30a, 30b are surrounded by relatively the thick oxide film 35, and accordingly, the polysilicon layers 30a, 30b, 30c are exposed.

Then, metalization which is not shown is made so as to complete the Bi-CMOS type semiconductor integrated circuit.

SECOND EMBODIMENT

Figure 4A:
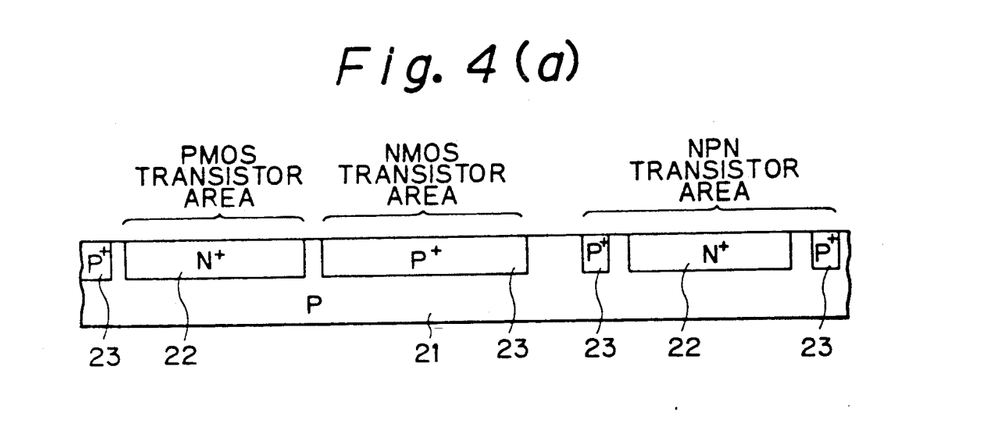
Figure 4B:
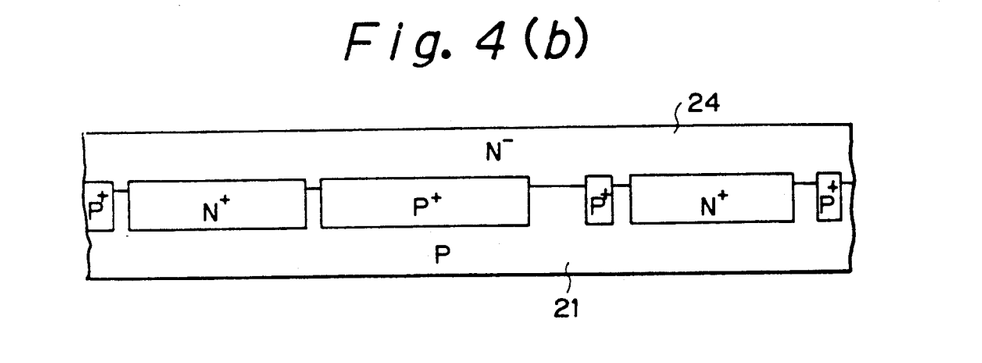
Figure 4C:
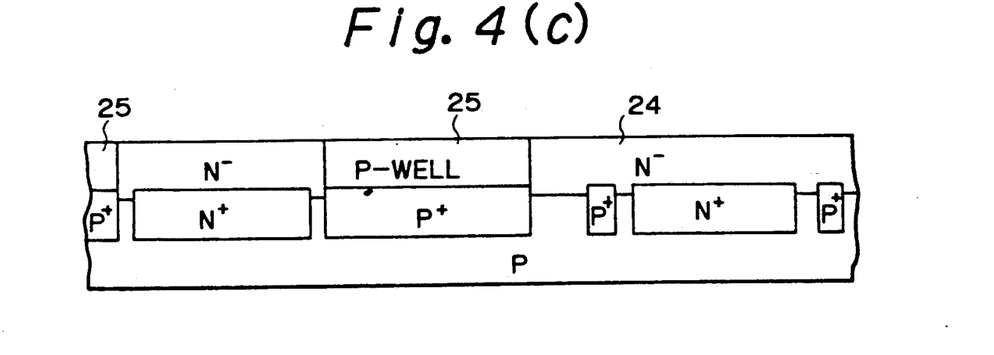
Figure 4D:
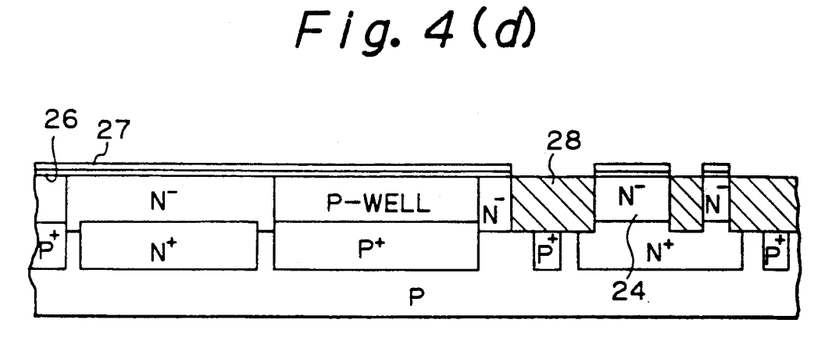
Figure 4E:
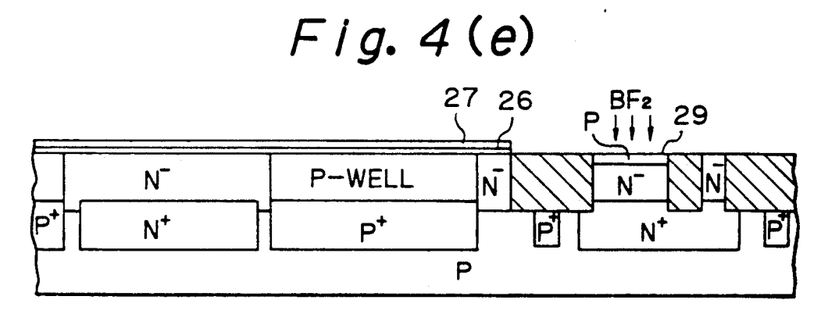
Figure 4F:
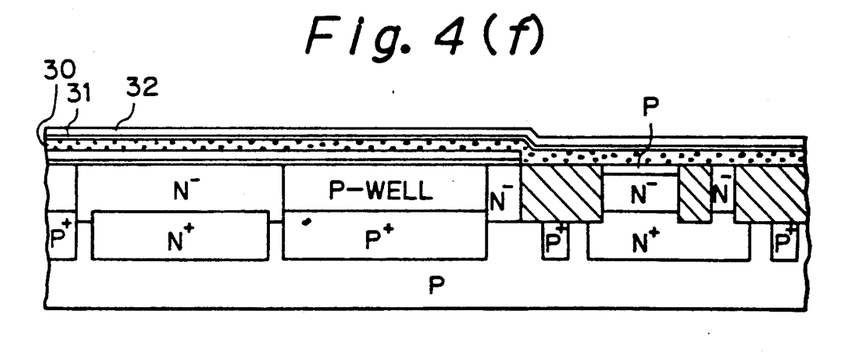

FIGS. 4(a) to 4(m) show the second embodiment of the present invention. In this second embodiment, the same process steps as those of the first embodiment are taken up to the step of removing the polysilicon layer 30, the oxide film 31 and the nitride film 32 which have been formed over the whole surface of the semiconductor substrate, from the MOS transistor forming area (which corresponds to that shown in FIGS. 4(a) to 4(g)). Accordingly, the essential points of the process steps as mentioned above will be briefly explained. At first, after an N+ buried diffusion layer 22 and a P+ buried diffusion layer 23 is formed on a P type semiconductor substrate 21 (refer to FIG. 4(a)), an N− epitaxial layer 24 is formed on the substrate 21 (refer to FIG. 4(b)). Then, a P well layer 25 is formed in the epitaxial layer 24 (refer to FIG. 4(c)). An oxide film 26 and a nitride film 27 are formed on the whole surface of the semiconductor substrate, and are removed in part. After the epitaxial layer 24 where the oxide film 26 and the nitride film 27 is not covered, being etched to a predetermined thickness, a thick first isolation oxide film 28 for isolation between NPN transistors is formed by selective oxidation (refer to FIG. 4(d)). The remaining nitride film 26 and thin oxide film 26 are removed from only the NPN transistor area, and a main base layer 29 for the NPN transistor is formed by ion-implantation (FIG. 4(e)). Thereafter, a polysilicon layer 30, an oxide film 32 and a nitride film 32 are formed over the whole surface of the semiconductor substrate 21 (refer to FIG. 4(f)), and are removed from a MOS transistor area (FIG. 4(g)).

Figure 4G:
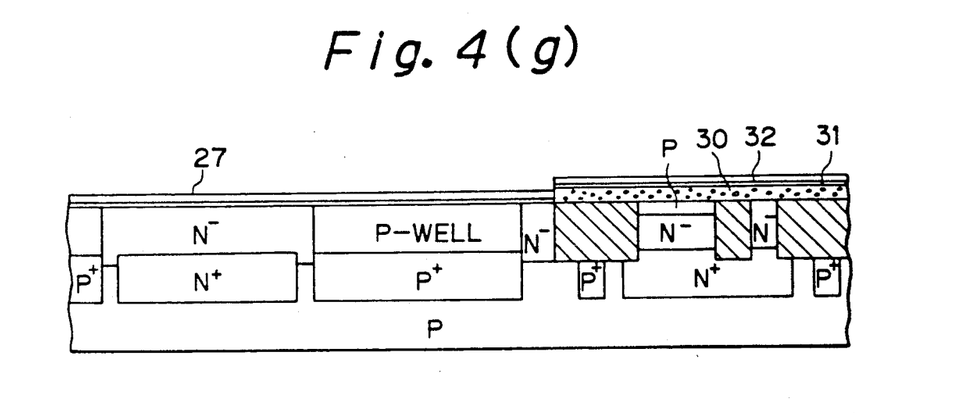
Figure 4H:
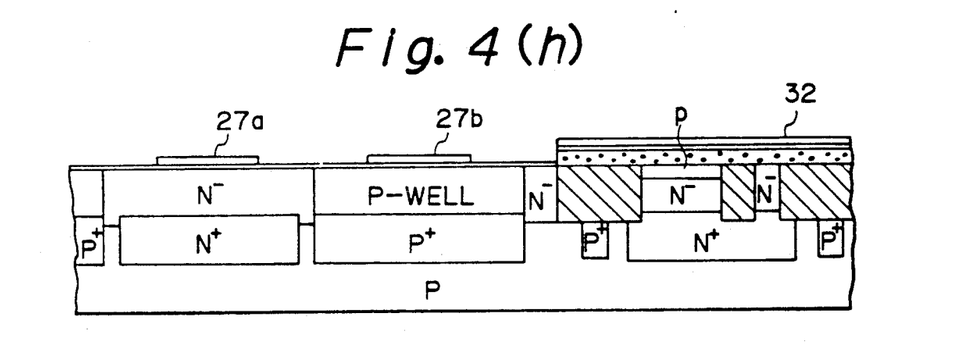

Thus, after the structure shown in FIG. 4(g) is obtained, then, as shown in FIG. 4(h), the nitride film 27 is selectively removed while it being allowed to remain as nitride film patterns 27a, 27b on the active area of the PMOS transistor by a well-known technique.

Figure 4I:
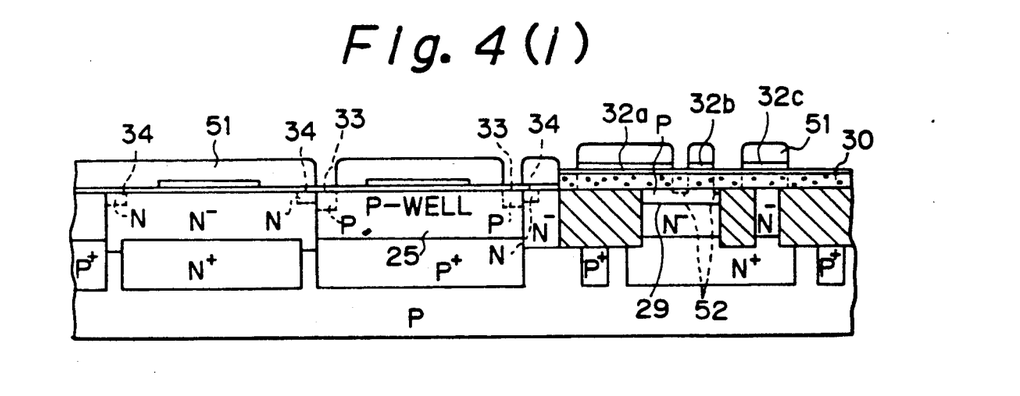
Figure 4J:
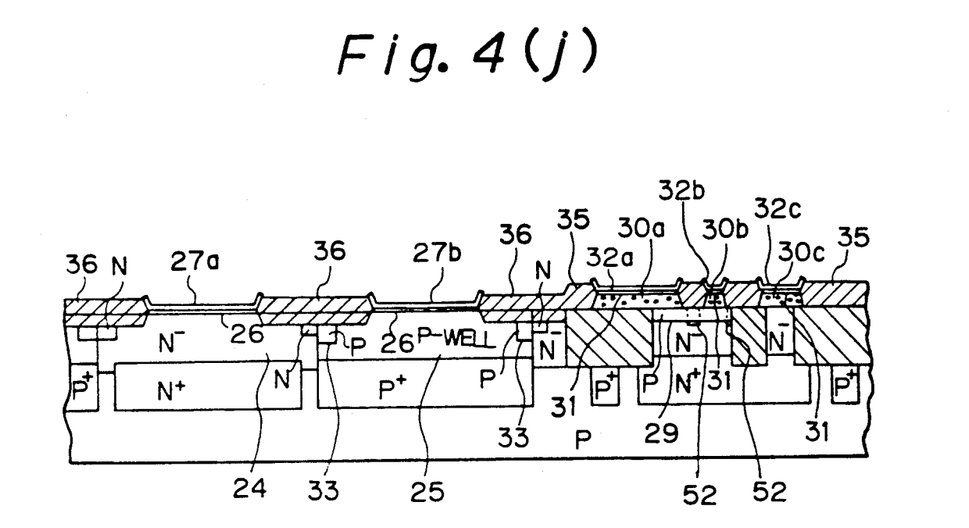

Then, a resist pattern which is not shown is formed on the semiconductor substrate, and using the resist pattern as a mask, an N type dopant is ion-implanted in order to form a channel stopper layer 34 for the PMOS transistor as shown in FIG. 4(i). Next, after a resist pattern 51 are shown in FIG. 4(i) is formed, patterning is made for the nitride film 32 so as to form nitride film patterns 32a, 32b, 32c which remain on the polysilicon layer and which serve as lead-out electrodes for the side base, emitter and collector of the NPN transistor. Next, using the resist pattern 51 as a mask, a P type dopant such as a B is ion-implanted in the P well layer in order to form a channel stopper layer 33 for the NMOS transistor, and simultaneously, a dopant is implanted into the main base layer 29 through the polysilicon layer 29 around the emitter area from which the above-mentioned nitride film 32 is removed, in order to form a bridge base layer 52. Thereafter, the resist pattern 51 is removed, and it is annealed at a temperature of about 900 deg. C. This annealing activates the implanted dopant so as to form the channel stopper layers 34, 33 for the PMOS and NMOS transistors respectively, and the bridge base layer 52 is formed in the main base layer 29, being positioned around the emitter forming area.

Thereafter, process steps similar to those in the first embodiment are taken. That is, using the remaining nitride film patterns 27a, 27b, 32a, 32b, 32c as masks, the second selective oxidation process is performed. By this second oxidation process, the polysilicon layer 30 is separated into a polysilicon layer 30a serving as a side base lead-out electrode for the NPN transistor, a polysilicon layer 30b serving as an emitter lead-out electrode for the same transistor and a polysilicon layer 30c serving as a collector lead-out electrode for the same transistor. Reference numeral 35 denotes an oxide film into which the polysilicon layer 30 is turned. Simultaneously, a second isolation oxide film 36 for isolation between the NMOS transistor and the PMOS transistor is formed on the P well layer 25 and the surface of the epitaxial layer 24. At this time, even with this second selective oxidation, it is desirably treated at a relatively low temperature with the use of a high pressure oxidation process in order to avoid increasing the junction depth of the main base layer 29 as far as possible. For example, with the oxidation under a pressure of 8 atm. at a temperature of 1,000 deg. C. for about 20 minutes, an oxide film having a thickness of 5,000 to 7,000 Å is formed. Meanwhile, since the bridge base layer 52 and the channel stopper layer 33 have been formed by a high dose ion-implantation, redistribution is effected in accordance with a dopant concentration during the second selective oxidation, and accordingly, a deep junction is formed.

Further, the nitride film patterns are all removed by hot phosphoric acid, and then, the thin films 26, 31 therebelow are removed simultaneously. When removing these oxide films 26, 31, since the oxide films 35, 36 are a relatively thicker sufficient overetching is made so as to remove bird's beaks which have been produced by the above-mentioned selective oxidation.

Figure 4K:
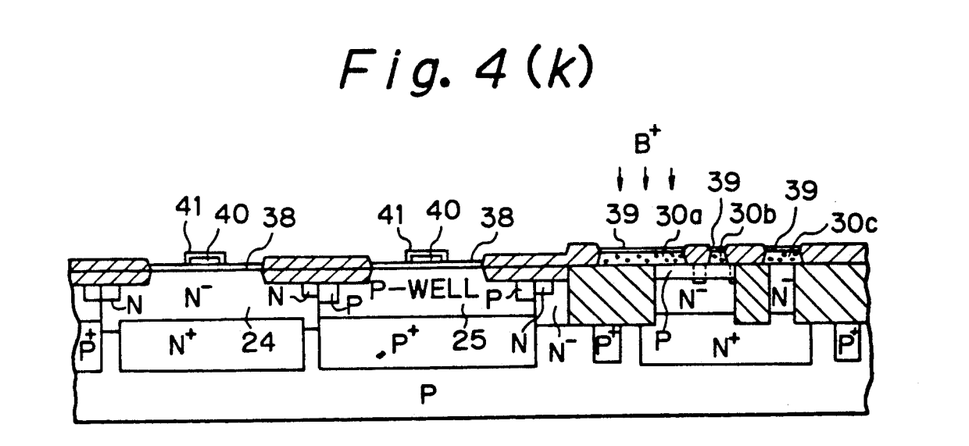

Next, as shown in FIG. 4(k), a gate oxide film 38 for the PMOS and NMOS transistors is formed on the epitaxial layer 24 and on the P well layer 25. At this time, an oxide film 39 is simultaneously formed on the polysilicon layers 30a, 30b, 30c. Then, the surface concentration of the N$^-$ epitaxial layer 24 in the PMOS transistor forming area is adjusted as necessary with the use of ion-implantation in order to control the threshold voltage $V_T$ of this area. Further, using a resist as a mask which is not shown, a high dose of P type dopant such as B or the like is selectively ion-implanted in the polysilicon layer 30a. Then, a polysilicon gate electrode 40 for the PMOS and NMOS transistors is formed, and a masking oxide film 41 having about 200 Å is formed around the polysilicon gate electrode.

Figure 4L:
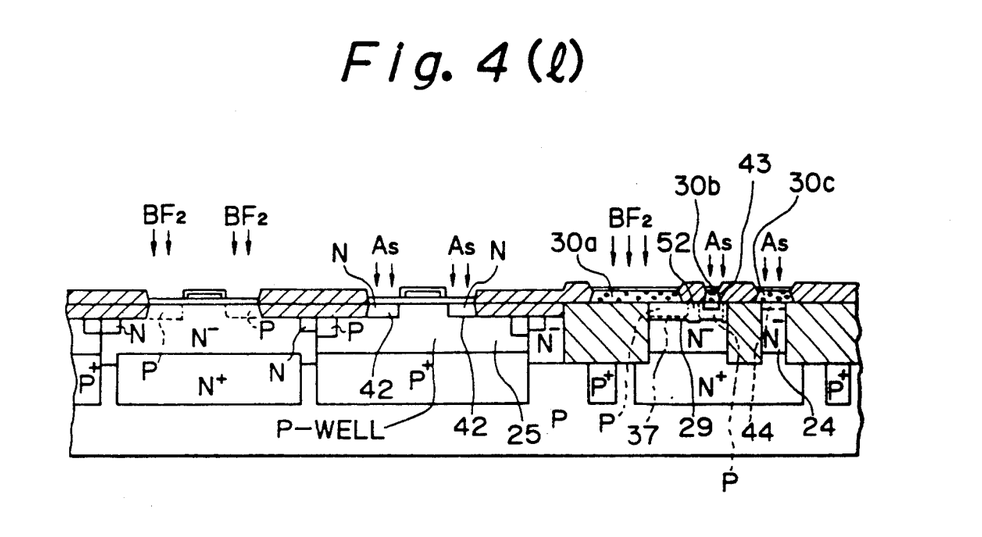

Further, as shown in FIG. 4(l), using a resist as a mask which is not shown, As which is N type dopant with a high dose of $10^{16}$ cm$^{-2}$ is ion-implanted into the source drain area of the NMOS transistor and into the polysilicon layers 30b, 30c serving as the emitter lead-out electrode and the collector lead-out electrode for the NPN transistor. Then, after the resist being removed, it is annealed at 950 deg. C. so as to form a source drain layer for the NMOS transistor in the P well layer 25. At this time, the N type dopant is simultaneously diffused into the main base layer 29 and the epitaxial layer 24, respectively from the polysilicon layers 30b, 30c so as to form an emitter layer 43 and a high doped collector layer 44 for the NPN transistor. Further, at this time. the P type dopant which has been implanted with a high dose in the polysilicon layer 30a is also diffused into the main base layer 29, and deeply form the side base layer 37 which is connected to the bridge base layer 52 that has been previously formed. As a result, an inactive base with a high dose is completed.

Figure 4M:
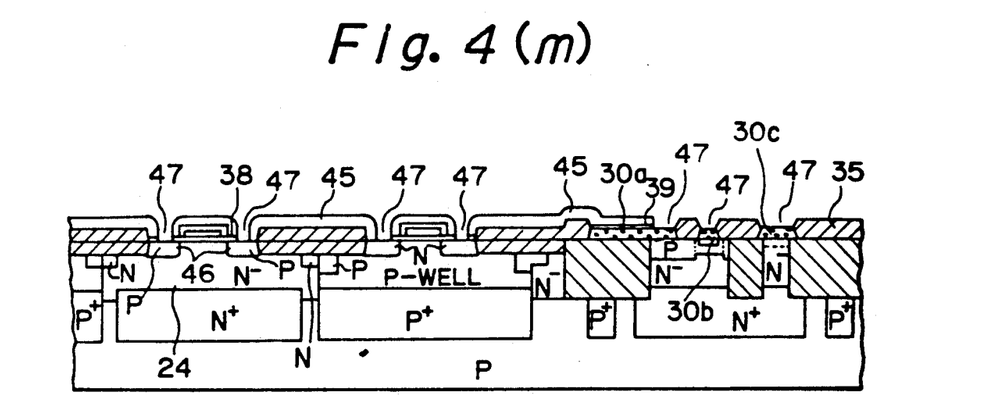

Next, again using a resist as a mask which is not shown, as shown in FIG. 4(l), a P type dopant such as BF$_2$$^+$ or the like is implanted at a high dose of about $10^{15}$ cm$^{-2}$, into the source drain of the PMOS transistor, and into the polysilicon layer 30a which serves as the side base lead-out electrode. Thereafter, as shown in FIG. 4(m), a BPSG layer 45 serving as an intermediate insulation film is formed over the whole surface of the semiconductor substrate, and it is then annealed for smoothening the BPSG layer 45. This anneal activates the above-mentioned dopant so as to form a source drain layer 46 for the PMOS transistor in the epitaxial layer 24. Further, the dopant in the polysilicon layer 30a has a role of lowering the resistance value of the polysilicon layer 30a.

Thereafter, as shown in FIGS. 4(m), contact holes 47 are formed in the BPSG layer 45 and the oxide films 38, 39. Contact holes 47 above the NPN transistor are self-aligningly formed by removing the BPSG film 45 and the oxide film 39 in batch since the polysilicon layers 30a, 30b, 30s are all surrounded by a relatively thick oxide film 35, and accordingly, the polysilicon layers 30a, 30b, 30c are exposed.

Finally, metalization which is not shown is made so as to complete the Bi-CMOS semiconductor integrated circuit.

As explained in detail above, the manufacturing process according to the present invention gives the following advantages:

(1) Since the PMOS and NMOS transistor isolation areas are selectively oxidized so as to form the second isolation oxide film, simultaneously with the selective oxidation of the polysilicon layer deposited on the bipolar transistor area after the semiconductor substrate in the bipolar transistor isolation area, which has been removed at a required thickness and selectively oxidized so as to form a thick first isolation oxide film for the bipolar transistor, an optimum isolation oxide film in accordance with a kind of a transistor, that is, a thick oxide film in the case of a bipolar transistor, and a conventional isolation oxide film in the case of PMOS or NMOS transistor can be formed. Accordingly, the problem of increasing the substrate capacity or isolation capacity of the bipolar transistor, and a prior problem in which the packing density of the CMOS part is lowered, and in which the conventional CMOS design rules cannot be used, can be both eliminated. Moreover, since the conventional oxide films for the PMOS and NMOS transistors (CMOS transistor) are formed by the process step of selectively oxidizing the polysilicon layer for the bipolar transistor, it is possible to prevent an increase in the number of process steps, and an increase in the junction depth caused by an increase in the number of heat treatment steps even though two kinds of isolation oxide films are formed.

(2) Since the bridge base is formed in the main base layer for the bipolar transistor with the use of the process step of forming the channel stopper layer for the MOS transistor, the base series resistance of the bipolar transistor can be reduced without increasing the number of the process steps.

(3) Since a diffusion from the separated polysilicon layers, which are isolated by the selective oxidation, is used, the base and emitter layers are formed self-aligningly. Further, since the polysilicon lead-out electrodes are respectively surrounded by a relatively thick oxide film, contact holes can be opened self-aligningly to the lead-out electrode above the bipolar transistor by removing the intermediate insulation film in batch. Further, with the use of the above-mentioned process steps, it is possible to aim at enhancing the packing density of the bipolar transistor.

What we claim is:

1. A process of manufacturing a Bi-CMOS type semiconductor integrated circuit, comprising the steps of:
   (a) selectively removing a first mask layer which has been formed on a semiconductor substrate within an isolation area for a bipolar transistor, and after the semiconductor substrate in that part is removed at a required thickness by use of the remaining first mask layer as a mask, selectively oxidizing the semiconductor substrate in the same part by use of the remaining first mask layer as a mask so as to form a thick first isolation oxide film for isolation between active areas of the bipolar transistor;
   (b) selectively removing the remaining first mask layer from the bipolar transistor forming area;
   (c) forming a polysilicon layer and a second mask layer on said semiconductor substrate, and selectively removing the second mask layer and the polysilicon layer in that order from areas other than the bipolar transistor forming area;
   (d) selectively removing the first and second mask layers on said semiconductor substrate while allowing the first mask layer on active areas of PMOS and NMOS transistors and the second mask layer on said polysilicon layer in areas where lead-out electrodes for a side base, an emitter and a collector of the bipolar transistor are formed, to remain thereon; and
   (e) thereafter, selectively oxidizing the surface of the semiconductor substrate and the polysilicon layer by use of the remaining first and second mask layers as masks so as to divide and separate the polysilicon layer into said lead-out electrodes, and simultaneously forming a second isolation oxide film for isolation between the PMOS and NMOS transistors, on the surface of the semiconductor substrate.

2. A process of manufacturing a Bi-CMOS type semiconductor integrated circuit comprising the steps of:
   (a) selectively removing a first mask layer which has been formed on a semiconductor substrate within an isolation area for a bipolar transistor, and removing the semiconductor substrate in that part at a predetermined thickness by use of the remaining first mask layer as a mask, selectively oxidizing the semiconductor substrate in the same part by use of the remaining first mask layer as a mask so as to form a thick first isolation oxide film for isolation between active areas of the bipolar transistor;
   (b) selectively removing the remaining first mask layer from he bipolar transistor forming area;
   (c) forming a main base layer on said semiconductor substrate in a main base forming area within the bipolar transistor forming area;
   (d) forming a polysilicon layer and a second mask layer on said semiconductor substrate, and selectively removing the second mask layer and the polysilicon layer from areas other than the bipolar transistor forming area;
   (e) selectively removing said first mask layer while allowing the first mask layer on active areas of PMOS and NMOS transistors to remain thereon;
   (f) forming a channel stopper layer for one of said PMOS and NMOS transistors, in the semiconductor substrate;
   (g) selectively removing said second mask layer while allowing the second mask layer on said polysilicon layer in areas where lead-out electrodes for the side base, the emitter and collector of the bipolar transistor are formed, to remain thereon;
   (h) forming a channel stopper layer for the other one of the PMOS and NMOS transistors on the semiconductor substrate, and simultaneously forming a bridge base layer having a high dopant concentration by implanting a dopant into a part of said main base layer through said polysilicon layer within the bipolar transistor forming area;
   (i) selectively oxidizing the surface of the semiconductor substrate and the polysilicon layer by use of the remaining first and second mask layers as masks so as to divide and separate the polysilicon layer into said lead-out electrodes, and simultaneously forming a second isolation oxide film for isolation between the PMOS and NMOS transistors, on the surface of the semiconductor substrate;
   (j) forming the PMOS transistor and the NMOS transistor in PMOS and NMOS transistor forming areas on the semiconductor substrate respectively while ion-implanting dopant into said lead-out electrode polysilicon layers so as to form a side base layer, an emitter layer and a high doped collector layer by diffusion from said polysilicon layers, thereby completing the bipolar transistor on the semiconductor substrate in the bipolar transistor forming area; and
   (k) thereafter, forming an intermediate insulating film over the whole surface of the semiconductor substrate, and removing said intermediate insulating film on the bipolar transistor in batch so as to expose said electrodes.

3. A process of manufacturing a Bi-CMOS type semiconductor integrated circuit according to claim 1, wherein the first mask layer has a first oxide layer and a first nitride layer.

4. A process of manufacturing a Bi-CMOS type semiconductor integrated circuit according to claim 3, wherein the step of removing the first mask layer comprises:
  removing the first nitride layer within the isolation area for the bipolar transistor; and
  removing the first oxide layer within the portion where the first nitride layer is removed.

5. A process of manufacturing a Bi-CMOS type semiconductor integrated circuit according to claim 1, wherein the second mask layer has a second oxide layer and a second nitride layer.

6. A process of manufacturing a Bi-CMOS type semiconductor integrated circuit according to claim 5, wherein the step of removing the second mask layer comprises:
  removing the second nitride layer; and
  removing the second oxide layer within the portion where the first nitride layer is removed.

7. A process of manufacturing a Bi-CMOS type semiconductor integrated circuit according to claim 1, further comprising the step of forming a channel stopper layer on the outside edge portions of the active areas of PMOS and NMOS transistors between said steps (d) and (e).

8. A process of manufacturing a Bi-CMOS type semiconductor integrated circuit according to claim 2, wherein the first mask layer has a first oxide layer and a first nitride layer.

9. A process of manufacturing a Bi-CMOS type semiconductor integrated circuit according to claim 8, wherein the step of removing the first mask layer comprises:
  removing the first nitride layer within the isolation area for the bipolar transistor; and
  removing the first oxide layer within the portion where the first nitride layer is removed.

10. A process of manufacturing a Bi-CMOS type semiconductor integrated circuit according to claim 2, wherein the second mask layer has a second oxide layer and a second nitride layer.

11. A process of manufacturing a Bi-CMOS type semiconductor integrated circuit according to claim 10, wherein the step of removing the second mask layer comprises:
  removing the second nitride layer; and
  removing the second oxide layer within the portion where the first nitride layer is removed.

* * * * *